United States Patent

[11] 3,617,391

[72] Inventors Martin P. Lepselter
New Providence, N.J.;
Herbert A. Waggener, Allentown, Pa.

[21] Appl. No. 857,859
[22] Filed Sept. 15, 1969
[45] Patented Nov. 2, 1971

[73] Assignee Bell Telephone Laboratories, Incorporated
Murray Hill, Berkeley Heights, N.J.

[54] METHOD FOR PRODUCING PASSIVATED PN-JUNCTIONS BY ION BEAM IMPLANTATION
9 Claims, 7 Drawing Figs.

[52] U.S. Cl. .......... 148/1.5, 29/576, 148/186, 148/187
[51] Int. Cl. .......... H01l 7/54
[50] Field of Search .......... 148/1.5, 186, 187; 29/576

[56] References Cited
UNITED STATES PATENTS

| | | | |
|---|---|---|---|
| 3,431,150 | 3/1969 | Dolan, Jr. et al. | 148/1.5 |
| 3,434,894 | 3/1969 | Gale | 148/1.5 |
| 3,533,158 | 10/1970 | Bower | 148/1.5 |

*Primary Examiner*—L. Dewayne Rutledge
*Assistant Examiner*—R. A. Lester
*Attorneys*—R. J. Guenther and Arthur J. Torsiglieri

ABSTRACT: A method for producing tucked under, passivated PN-junctions in semiconductor devices by ion implantation through a layered mask. Apertures in the upper layers of the mask are formed somewhat larger than the corresponding apertures in a first layer (contiguous with the surface of the semiconductor) so that an annulus of uncovered first layer remains around each exposed portion of semiconductor surface. Then the structure is subjected to a beam of dopant ions of sufficient energy to pass through the exposed annulus of uncovered first layer but of insufficient energy to pass through the area covered by the multiple layers; and a tucked under, passivated junction thereby is formed.

INVENTORS M. P. LEPSELTER
H. A. WAGGENER
BY Arthur J. Torsiglieri
ATTORNEY

METHOD FOR PRODUCING PASSIVATED PN-JUNCTIONS BY ION BEAM IMPLANTATION

BACKGROUND OF THE INVENTION

1 Field of the Invention

This invention relates generally to the fabrication of semiconductor devices; and, more particularly, to the formation of tucked under, passivated junctions by ion implantation through a mask.

2. Description of the Prior Art

One of the generally desirable characteristics of the ion implantation method of introducing dopant impurities into a semiconductor surface is that the dopant impurities proceed in a substantially straight line path without the isotropic, sideways movement of impurities which is characteristic of a diffusion process. This straight line characteristic does create a problem, however, in that planar junctions produced by ion implantation are not normally tucked under a protective, passivating oxide where the junction intersects the surface of the device, as is generally desirable.

One way of solving this problem, as disclosed in U.S. Pat. No. 3,388,009, issued June 11, 1968, is to implant the dopant ions through a mask and then form a new protective coating over the surface so that the apertures in the new protective coating are smaller than the corresponding apertures in the mask. This method, of course, results in junctions which are tucked under the edges of the apertures in the new coating. However, this method is unsatisfactory for many applications in that it is difficult to align accurately the apertures in the new coating with the apertures in the original ion implantation mask. Alignment becomes increasingly difficult as device geometries decrease in size.

SUMMARY OF THE INVENTION

Accordingly, a primary object of the present invention is a method for fabricating tucked under, passivated junctions by ion implantation without incurring the above-described alignment problem.

To this and other ends, the method in accordance with out invention includes the use of a layered mask against which a beam of high-energy dopant ions is directed to produce the desired junction configuration.

More specifically, in accordance with our invention, there is formed a first mask of a first material on a surface of a semiconductive body, the first mask having an aperture therein so that a selected portion of the surface of the body is exposed. There also is formed a second mask of a second material over and contiguous with the first mask, the second mask having an aperture registered with the aperture in the first mask and larger than the aperture in the first mask so that an annulus of the first mask is not covered by any portion of the second material. The structure then is subjected to a beam of dopant ions having energies sufficient to penetrate the uncovered portion of the first mask and sufficient to alter the conductivity of the semiconductor thereunder, but of energy insufficient to penetrate completely the portions in which the second mask overlies the first.

Still more specifically, in accordance with the preferred embodiment of our invention, there is formed a first relatively thin layer of a first material over the surface of a semiconductor body. A second layer of a second material is formed thereover.

An apertured mask is formed over the second layer; and the structure is immersed in an ambient which etches the second material but which advantageously does not appreciably attack the first material. In this manner there is formed a void in the second layer under the aperture in the mask. The mask may then be removed; and the structure immersed in an ambient which etches the first material but which advantageously does not appreciably attack the second material. In this manner there is formed a void in the fist layer under the void in the second layer, and a portion of the surface of the body is exposed.

The structure is then immersed in the ambient which etches the second material but not the first material so that the second layer simultaneously is thinned and the void in the second layer is enlarged so that an annulus of uncovered first material is left around the perimeter of the void in the first layer.

The structure is then subjected to a beam of dopant ions having energy sufficient to penetrate the uncovered annulus of the first layer but insufficient to penetrate the combined remaining second layer and first layer. In this manner there is formed a PN junction which intersects the surface underneath the annulus of the first layer so that the junction is tucked under and is passivated by the first layer. Depending upon the choice of specific materials, additional layers advantageously may be added to those described above. This will be described in more detail hereinbelow.

Also, selective backsputtering, rather than the above-described selective etching, may be used to form the apertures in the layered mask, if desired. Selective backsputtering is well known in the art and is taught, for example, in U.S. Pat. No. 3,271,286, issued Sept. 6, 1966 to M. P. Lepselter, and assigned to the assignee hereof.

DESCRIPTION OF THE DRAWING

The foregoing and other objects, features and advantages of the invention will be more clearly understood from the following detailed description taken in conjunction with the drawing, in which.

Figure 1:
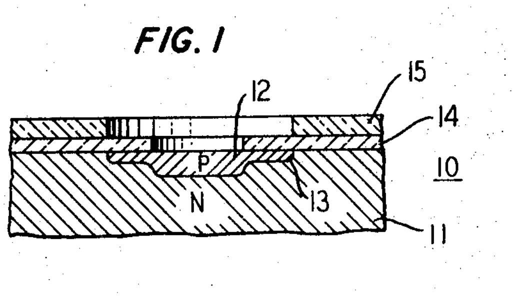
FIG. 1 shows a cross section of a semiconductor body having a PN junction formed by ion implantation through a layered mask in accordance with our invention.

It will be understood that for clarity and simplicity of explanation the FIGS. of the drawing have not necessarily been drawn to scale.

DETAILED DESCRIPTION

With reference now to the drawing, FIG. 1 shows a portion 10 of a semiconductive body containing a PN junction 13 which has been formed by ion implantation in accordance with our invention. It will be seen that the portion of junction 13 which intersects the surface of the body is tucked under a passivating dielectric layer 14.

The results of the more significant steps in the process leading to the structure shown in FIG. 1 are illustrated by FIGS. 2–6.

Figure 2:
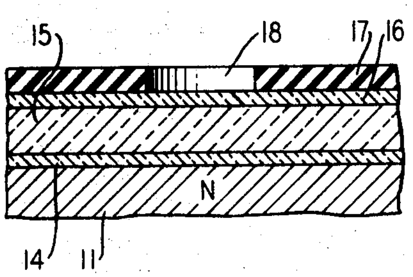
FIG. 2–6 show the semiconductor portion of FIG. 1 substantially as it appears following successive fabrication steps leading up to the structure shown in FIG. 1.

More specifically, as shown in FIG. 2, we begin by forming a first layer 14 over and contiguous with the surface of a semiconductive portion 11, typically of silicon. Preferably, layer 14 is a dielectric suitable for use as the passivating layer, e.g., a thermally grown silicon oxide layer about 1,000 A. or more in thickness. However, other dielectrics may be used; or, a deposited layer of silicon oxide may be used instead of the thermally grown layer.

Over layer 14 there is formed a second layer 15 of a material different from the material of layer 14 so that selective etching will be enabled. Preferably layer 15 is a dielectric, e.g., approximately 3,000 A. or more of aluminum oxide or silicon nitride, which may be formed by evaporation, sputtering or thermal decomposition.

Then, for practical reasons, which will be explained hereinbelow, there is formed over layer 15 a third layer 16 which advantageously is of the same material as contained in layer 14. However, layer 16 may be a dissimilar material, provided that it be etched by a solution which does not attack layer 15 appreciably and also that it not be attacked appreciably by the solution to be used to etch layer 15.

Over layer 16 there is formed in known fashion a photoresist mask 17 which includes an aperture 18, as shown, over the area of the semiconductor surface in which the PN junction is desired to be formed.

Next the structure of FIG. 2 is subjected to an ambient, e.g., hydrofluoric acid, which etches the material of layer 16 but does not appreciably attack the photoresist material 17, the result being that an aperture is formed in layer 16 underneath the aperture in the photoresist mask with some undercutting. The resultant structure is shown in FIG. 3.

Figure 3:
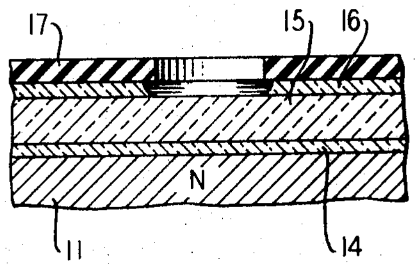

Subsequent to forming the structure of FIG. 3, the photoresist mask is removed and the resultant structure is exposed to an ambient, e.g., hot phosphoric acid at about 170° C. which etches layer 15, e.g., aluminum oxide, but does not appreciably attack bottom layer 14. In this manner an aperture is formed in layer 15 underneath the aperture in layer 16 with some undercutting and the etching process is self-terminating inasmuch as layer 15 is not attacked. The resultant structure shown in FIG. 4.

Figure 4:
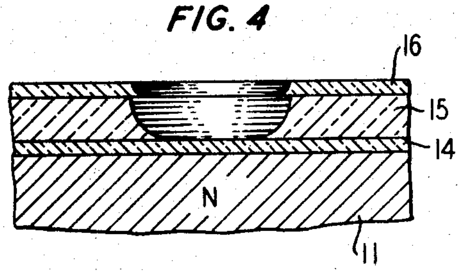
Figure 5:
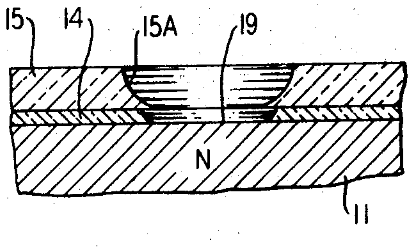

Next the structure shown in FIG. 4 is subjected to an ambient, e.g., hydrofluoric acid, which etches layers 14 and 16, but which does not appreciably attack the material of layer 15 or the semiconductor 11. In this manner layer 16 is completely removed and that portion of layer 14 exposed through the aperture in layer 15 is etched through to expose a portion 19 of the silicon surface as shown in FIG. 5.

Next the structure of FIG. 5 is subjected again to the ambient which etches layer 15 but which does not appreciably attack the material of layer 14. As layer 15 is etched, it becomes thinner, but more importantly, the sidewall 15A of the aperture in layer 15 moves laterally to create a larger aperture as the etching progresses. It will be appreciated that this uncovers an annulus 20 of the material of layer 14 surrounding the aperture in layer 14.

Figure 6:
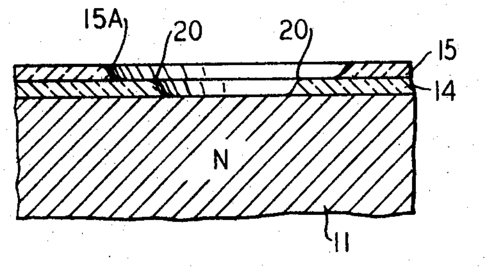

Having achieved the structure of FIG. 6, the next step is to subject the device to a beam of high-energy dopant ions to form the PN junction as shown in FIG. 1. For example, to convert the structure shown in FIG. 6 into the structure shown by FIG. 1, a beam of light energy, e.g., about 200 Kev., boron ions is directed in known fashion to the surface of the semiconductive body. Layers 14 and 15 act as a mask, and, provided the energy of the beam is sufficient that the ions penetrate the uncovered portion of layer 14 around the aperture but do not penetrate the combined dielectric layers 14 and 15, the localized zone 12 and the corresponding junction 13, as shown in FIG. 1, are formed.

For example, a 100 Kev. beam of boron ions penetrates about 3,000 A. into exposed silicon and forms half-width of about 600 A. Thus, since a beam penetrates silicon oxide about as much as it penetrates silicon, 100 Kev. ions passing through the 1,000 A thick uncovered annulus 20 of layer 14 will penetrate into the silicon about 2,000 A. A 100 Kev. beam will not penetrate completely the at least 4,000 A. thick combined regions which comprise at least 3,000 A of aluminum oxide and 1,000 A. of silicon oxide.

As is well-known in the art, the doping profile may be controlled as desired by modulating the beam energy, current, and time duration, such as disclosed, for example, in the article "Ion Implantation in Semiconductors," by J. F. Gibbons, in Proc. IEEE, Vol. 56, No. 3, March, 1968, pages 295–319.

It will be apparent to those skilled in the art that layer 15 may be left as a part of the structure of provide additional passivation or may be removed, as desired.

Referring back now to the multiple layers, only two layers are essential to our invention. However, in the above-described embodiment using silicon oxide as the first layer 14 and aluminum oxide as the second layer 15, a third layer 16 which includes silicon oxide advantageously is employed because the known photoresist masks are not considered completely satisfactory, for most applications, in the hot phosphoric acid usually used to etch aluminum oxide. Hence, a more satisfactory "mask" of silicon oxide 16 is first formed using a photoresist mask as described.

It will be understood that other arrangements may be devised by those skilled in the art without departing from the spirit and scope of our invention.

For example, none of the masking layers need be dielectrics. Any or all of those layers may be conductive, as selected by the worker in the art of particular situations. For example, 1,000 A or more of copper may be used for layer 15; and in this case layer 16 could be dispensed with an a nitric acid solution could be used for selectively etching the copper. Of course, if a metal is used for layer 15, it would be normally removed after implantation to avoid inter-device electrical shorts.

Figure 7:
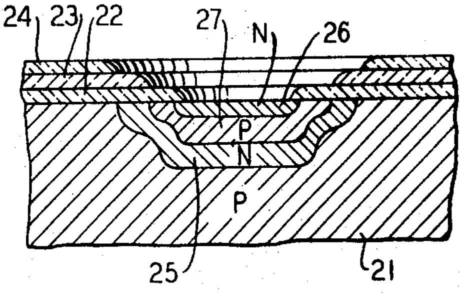
FIG. 7 shows a cross section of a semiconductor body incorporating multiple FIGURES formed and passivated in accordance with our invention.

Further, multiple layers and selective etching may be employed to form a mask through which successive implantations and/or diffusions may be performed to produce nested PN junctions, as shown in FIG. 7.

As shown in FIG. 7, three masking layers 22, 23, and 24 are formed over a semiconductive body 21, e.g., P-type. The void in layer 23 is larger than the void in layer 22; and the void in layer 24 is larger than the void in layer 23. A first implantation of N-type dopant ions having energy sufficient to penetrate layers 22 and 23 forms the "buried" localized N-type zone 25. Such buried implantations are described, for example, in U.S. Pat. No. 3,431,150, issued Mar. 4, 1969 to R. P. Dolan Jr., et al. Then an N-type surface zone 26 is formed by solid-state diffusion or by ion implantation, as desired. It will be apparent that N-type zone 26 may be an emitter, P-type zone 27 a base, and N-type zone 25 a collector for a transistor.

Although these samples have been described in terms of single devices, it is obvious that many such devices may be made in a single semiconductive body, e.g., in integrated circuit configurations. For example, a transistor as shown in FIG. 7 is a self-isolated transistor advantageously employed in integrated circuits, as described in more detail in the copending U.S. application, Ser. No. 703,164 filed Feb. 5, 1968 in the name of B. T. Murphy and assigned to the assignee hereof.

What is claimed is:

1. A method of forming by ion implantation a localized zone in a semiconductive body comprising the steps of:
   forming a mask on a surface of the body, said mask comprising a first layer contiguous with the surface of the body and a second body overlying the first; both layers having registered apertures therein through which a portion of the surface of the body is exposed; the aperture in the second layer being larger than the aperture in the first layer so that an annulus of material in the first layer around the perimeter of the aperture in the first layer is not covered by the second layer; and
   subjecting the structure to a beam of dopant ions having energy sufficient to penetrate the uncovered material of the first layer and sufficient to alter the semiconductivity of the semiconductor thereunder but insufficient to penetrate completely the regions in which the second layer overlies the first.

2. A method of forming by ion implantation a localized zone in a semiconductive body comprising the steps of:
   applying first coating of a first material to the surface of the body;
   applying a second coating of a second material over said first coating;
   removing selected portions of said second material so that an aperture is formed in the second coating and a portion of the first coating thereby is uncovered;
   removing selectively the uncovered portion of the first coating so that a portion of the semiconductor surface thereby is uncovered;
   enlarging the aperture in the second coating so that an annulus of the material of the first coating is left uncovered around the perimeter of the aperture in the first coating; and
   subjecting the structure to a beam of dopant ions having energy sufficient to penetrate the uncovered portion of the first coating and sufficient to alter the semiconductivity of the semiconductor thereunder but insufficient to penetrate completely the regions in which the second coating overlies the first.

3. A method as recited in claim 2 wherein the first coating includes silicon oxide and the second coating includes a material selected form the group consisting of aluminum oxide and silicon nitride.

4. A method of forming by ion implantation a localized zone in a semiconductive body comprising the steps of:

applying a first coating of a first material to the surface of the body;

applying a second coating of a second material over said first coating;

removing selected portions of said second material by exposing selected regions of the second coating to an ambient which causes removal of the second material much faster than the first material so that an aperture is formed in the second coating and a portion of the first coating thereby is uncovered.

exposing the structure to an ambient which causes the removal of the first material much faster than the second material so that an aperture is formed in the first material underneath the aperture in the second material and a portion of the semiconductor surface thereby is uncovered;

exposing the structure to an ambient which causes removal of the second material much faster than the first material so that the second coating is thinned and the aperture in the second coating is enlarged so that an annulus of uncovered first material is left around the perimeter of the aperture in the first coating; and subjecting the structure to a beam of dopant ions having energy sufficient to penetrate the uncovered portion of the first material but not sufficient to penetrate the covered portion of the first material.

5. A method as recited in claim 4 wherein the first material is silicon oxide and the second material is aluminum oxide.

6. A method as recited in claim 5 wherein phosphoric acid is used to etch the aluminum oxide and hydrofluoric acid is used to etch the silicon oxide.

7. A method of forming by ion implantation a localized zone in a semiconductor body comprising the steps of:

applying a first coating of a first material to the surface of the body;

applying a second coating of the second material over said first coating;

applying a third coating of a third material over said second coating;

removing selected portions of said third material by exposing selected regions of said third coating to a solution which etches said third material much faster than said second material, so that an aperture is created in the third coating and a portion of the upper surface of the second coating thereby is uncovered;

removing the uncovered portion of the second material by exposing that portion of the second material to a solution which etches said second material much faster than either said third material or said first material, so that an aperture is created in the second coating and a portion of the upper surface of the fist coating thereby is uncovered;

removing the uncovered portion of the first material and the entire remaining portions of the third material by exposing that portion of the third material and those remaining portions of the first material to a solution which etches said first material and said third material much faster than said second material, so that an aperture is created in the fist coating and a portion of the upper surface of the semiconductor body thereby is uncovered;

immersing the remaining structure in a solution which etches the second material much faster than the third material so that the second coating is thinned and the aperture in the second coating is enlarged so that annulus of uncovered first material is left around the perimeter of the aperture in the first coating;

subjecting the structure to a beam of ions having energy sufficient to penetrate the uncovered portion of the first material but not sufficient to penetrate the covered portion of the first material.

8. A method as recited in claim 7 wherein the first material is the same as the third material.

9. A method as recited in claim 8 wherein the first material is silicon oxide.

* * * * *